(12) United States Patent
Hoffman (10) Patent No.: US 6,576,998 B1
(45) Date of Patent: Jun. 10, 2003

(54) THIN SEMICONDUCTOR PACKAGE WITH SEMICONDUCTOR CHIP AND ELECTRONIC DISCRETE DEVICE

(75) Inventor: Paul Robert Hoffman, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/086,293

(22) Filed: Feb. 28, 2002

(51) Int. Cl.[7] ............................................. H01L 23/34
(52) U.S. Cl. ....................... 257/724; 257/690; 257/692; 257/698; 257/685; 257/723; 257/738; 257/784; 257/786; 257/787
(58) Field of Search ................................. 257/723, 724, 257/685, 737, 738, 684, 796, 784, 786, 787, 690, 691, 692, 698

(56) References Cited

U.S. PATENT DOCUMENTS

| | | | |
|---|---|---|---|
| 5,474,957 A | 12/1995 | Urushima | 437/209 |
| 5,474,958 A | 12/1995 | Djennas et al. | 437/211 |
| 5,620,928 A | 4/1997 | Lee et al. | 438/118 |
| 5,646,828 A | 7/1997 | Degani et al. | 361/715 |
| 5,696,666 A | 12/1997 | Miles et al. | 361/764 |
| 5,835,355 A | 11/1998 | Dordi | 361/760 |
| 5,866,949 A | 2/1999 | Schueller | 257/778 |
| 5,903,052 A | 5/1999 | Chen et al. | 257/706 |
| 6,013,948 A | 1/2000 | Akram et al. | 257/698 |
| 6,034,427 A | 3/2000 | Lan et al. | 257/698 |
| 6,060,778 A | 5/2000 | Jeong et al. | 257/710 |
| 6,099,677 A | 8/2000 | Logothetis et al. | 156/253 |
| 6,100,804 A | 8/2000 | Brady et al. | 340/572.7 |
| 6,107,689 A | 8/2000 | Kozono | 257/778 |
| 6,127,833 A | 10/2000 | Wu et al. | 324/755 |
| 6,160,705 A | 12/2000 | Stearns et al. | 361/704 |
| 6,172,419 B1 | 1/2001 | Kinsman | 257/737 |
| 6,184,463 B1 | 2/2001 | Panchou et al. | 174/52.4 |
| 6,444,499 B1 * | 9/2002 | Swiss et al. | 438/127 |

FOREIGN PATENT DOCUMENTS

| | | | | |
|---|---|---|---|---|
| JP | 2000124576 A | * | 4/2000 | H05K/1/18 |
| KR | 10-2001-0018946 | | 3/2001 | |
| KR | 10-2002-0018944 | | 3/2001 | |

* cited by examiner

*Primary Examiner*—Nathan J. Flynn
*Assistant Examiner*—Pershelle Greene
(74) *Attorney, Agent, or Firm*—Bever, Hoffman & Harms, LLP; James E. Parsons (57) ABSTRACT

Semiconductor packages including at least one semiconductor chip and at least one electronic discrete device, such as a transistor, oscillator, optical sensor, resistor, capacitor, or inductor, are disclosed. The semiconductor chip and the discrete device are electrically coupled to each other, and are encapsulated within a protective encapsulant material. The semiconductor chip and the discrete device are disposed either in an aperture through the substrate or in a pocket of the substrate, thereby allowing for a thin package, even where the discrete device is taller (e.g., 1.5 to 5 times taller) than the semiconductor chip and/or substrate.

32 Claims, 7 Drawing Sheets

THIN SEMICONDUCTOR PACKAGE WITH SEMICONDUCTOR CHIP AND ELECTRONIC DISCRETE DEVICE

BACKGROUND

1. Field of the Invention

The present invention involves semiconductor chip packaging, and in particular involves semiconductor packages that include at least one semiconductor chip and at least one device.

2. Description of the Related Art

A typical ball grid array (BGA) semiconductor package includes a semiconductor chip mounted on an interconnective substrate. The substrate may be a glass-fiber filled organic laminate with electrically conductive circuit patterns on opposed upper and lower surfaces of the substrate. Bond wires electrically couple the semiconductor chip to the circuit patterns of the upper surface of the substrate. Vias through the substrate electrically couple the upper and lower circuit patterns. Conductive interconnection balls are fused to the circuit patterns of the lower surface of the substrate, and serve as input/output terminals of the package. A hardened encapsulant material covers the semiconductor chip, the upper surface of the substrate, and the bond wires. A disadvantage of such a package is that the package height is too great for certain applications.

In some applications, additional electronic components, such as one or more discrete devices, e.g., transistors, batteries, oscillators, optical components, resistors, capacitors, and inductors, are included in the semiconductor package with the semiconductor chip. The discrete device typically is taller than the semiconductor chip. Accordingly, such packages can have an even greater package height than the single chip package mentioned above. The height of such a semiconductor package is too great for certain applications.

Accordingly, there is a need for a thin semiconductor package for applications where the semiconductor package includes at least one semiconductor chip and at least one discrete device.

SUMMARY OF THE INVENTION

Disclosed herein are exemplary embodiments of semiconductor packages including at least one semiconductor chip and at least one electronic discrete device, such as, without limitation, a transistor, resistor, capacitor, inductor, oscillator, diode, or optical coupler, that are coupled to a package substrate. The semiconductor chip and the discrete device are electrically coupled to circuit patterns of the substrate, which electrically couple them to each other and to package input/output terminals disposed on a surface of the substrate. The packages may accommodate a plurality of the semiconductor chips and/or a plurality of the discrete devices.

In the exemplary embodiments, the discrete device has a height greater than a corresponding height of the semiconductor chip and the substrate. For instance, the discrete device may be 1.5 to 5 times taller than the semiconductor chip and the substrate. The semiconductor chip and the discrete device are disposed either in an aperture through the substrate or in a pocket of the substrate. The active surface of the semiconductor device and the terminals of the discrete device may be oriented in the same direction or opposite directions, and may be oriented in the same or an opposite direction as the input/output terminals on the substrate. The discrete device may be electrically coupled to the circuit patterns by an electrically conductive adhesive material, or by a layer of metal deposited over the substrate, among other possibilities.

The present invention is best understood by reference to the following detailed description when read in conjunction with the accompanying drawings.

BRIEF DESCRIPTION OF THE DRAWINGS

FIGS. 2a–2f are cross-sectional side views of an assembly process in accordance with the present invention for making the semiconductor package of FIG. 1;

FIGS. 4a–4c are cross-sectional side views of portions of an assembly process in accordance with the present invention for making the semiconductor package of FIG. 3;

Common reference numerals are used throughout the drawings and detailed description to indicate like elements.

DETAILED DESCRIPTION

The present invention provides a thinner semiconductor package for applications where one or more semiconductor chips are packaged together with one or more electronic discrete devices. Such electronic discrete devices may include active and passive devices, such as, without limitation, transistors, resistors, capacitors, inductors, crystal oscillators, switches, batteries, optical sensors, laser diodes, and optical couplers. In such packages, the height of the discrete device may be greater than the height of the semiconductor chip and/or the height of the interconnective substrate that serves as the package base. For instance, if the semiconductor chip has a height of 1X, the discrete device may have height of 1.5X to 5X, and the substrate may have a height of 0.5X to 3X.

In addition to being thinner than conventional semiconductor packages that include such elements, the packages of the present invention are also manufacturable using conventional materials and equipment. Hence, the benefit of reduced thickness is achieved without sacrifice to manufacturability, reliability, or cost.

Figure 1:
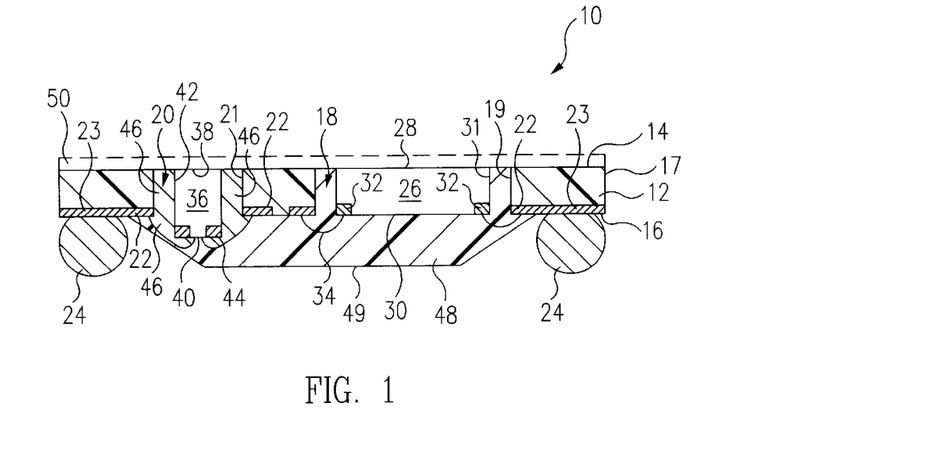
FIG. 1 is a cross-sectional side view of a first embodiment of a semiconductor package in accordance with the present invention.

FIG. 1 is a cross-sectional side view of a first embodiment of a semiconductor package in accordance with the present invention. Semiconductor package 10 of FIG. 1 includes at least one semiconductor chip 26, and at least one taller (e.g., 1.5, 3, or 5 times taller) discrete device 36. Of course, there may be a plurality of semiconductor chips 26 and discrete devices 36.

The base of semiconductor package 10 is a generally planar interconnective substrate 12. Substrate 12 may be formed of a variety of conventional substrate materials, such as a laminate (e.g., BT, FR4, or FR 5 materials), ceramic, or polyimide.

Substrate 12 includes a planar top surface 14, an opposite planar and parallel bottom surface 16, and peripheral orthogonal sides 17. At least two apertures are formed through substrate 12 between top surface 14 and bottom surface 16. A first aperture 18 has a rectangular perimeter and orthogonal sidewalls 19. A smaller second aperture 20 also is rectangular and includes orthogonal sidewalls 21. Semiconductor chip 26 is disposed in first aperture 18, and discrete device 36 is disposed in second aperture 20.

Bottom surface 16 of substrate 12 includes a plurality of electrically conductive circuit patterns 22, which may be formed of copper, aluminum, or some other conductive material. Portions of circuit patterns 22 may be plated with gold, nickel, silver, or another conventional metal to facilitate the attachment of bond wires or interconnection balls thereto.

Certain of the circuit patterns 22 electrically couple semiconductor chip 26 and discrete device 36 to each other. Others of the circuit patterns 22 electrically couple semiconductor chip 26 and discrete device 36 to electrically conductive interconnection balls 24, which serve as the input/output terminals of semiconductor package 10. Interconnection balls 24 may be formed of lead tin solder or some other metal, and are each fused to a land 23 at an outer end of a respective one of the circuit patterns 22. A layer of an insulative solder mask material (e.g., epoxy- or polyimide-based) may cover portions of the circuit patterns 22 and bottom surface 16 of substrate 12, excluding regions where connections are made to the circuit patterns 22.

As mentioned, semiconductor chip 26 is disposed within first aperture 18. Semiconductor chip 26 may be any type of semiconductor chip, such as a memory chip, a processor chip, or a logic chip.

Semiconductor chip 26 includes an inactive surface 28 in a common horizontal plane with top surface 14 of substrate 12. Semiconductor chip 26 also includes an active surface 30 that is opposite inactive surface 28, and peripheral side surfaces 31 that are in spaced opposition to orthogonal sidewalls 19 of first aperture 18 of substrate 12. Active surface 30 is oriented in the same direction as bottom surface 16 of substrate 12 and interconnection balls 24, and may be vertically above, below, or in the horizontal plane of bottom surface 16. Semiconductor chip 26 may be thinned by polishing or etching inactive surface 28.

A plurality of bond pads 32 along the periphery of active surface 30 of semiconductor chip 26 are each electrically coupled by a bond wire 34, or an equivalent electrical conductor (e.g., tab bonds or leads), to an inner end of a respective one of the circuit patterns 22 adjacent first aperture 18. Bond wires 34 may be gold or aluminum, among other possibilities. The location of bond pads 32 may vary. For instance, the bond pads 32 may be located at a central region of active surface 30, or both along the periphery and at a central region of active surface 30.

As mentioned, discrete device 36 is disposed within second aperture 20 of substrate 12 a selected distance from first aperture 18. Discrete device 36 includes a first surface 38 in the same horizontal plane as top surface 14 of substrate 12 and inactive surface 28 of semiconductor chip 26. Discrete device 36 also includes a second surface 40 that is opposite first surface 38, and is oriented in the same direction as bottom surface 16 of substrate 12. Second surface 40 includes at least two input/output terminals 44 of discrete device 36. Orthogonal side surfaces 42 of discrete device 36 extend between first and second surfaces 38 and 40, and are in spaced opposition to orthogonal sidewalls 21 of second aperture 20.

In the embodiment of FIG. 1, an electrically conductive adhesive material 46 is disposed within second aperture 20 of substrate 12. In particular, two bodies of electrically conductive adhesive material 46 are within aperture 20 adjacent opposite sides 42 of discrete device 36. One body of the electrically conductive adhesive material 46 contacts a first terminal 44 of discrete device 36, and also contacts at least one adjacent circuit pattern 22 of bottom surface 16 of substrate 12. A second body of the electrically conductive adhesive material 46 contacts a second terminal 44 of discrete device 36, and also contacts at least one adjacent circuit pattern 22 of bottom surface 16. Accordingly, the bodies of electrically conductive adhesive material 46 electrically couple discrete device 36 to circuit patterns 22 of substrate 12. As mentioned above, discrete device 36 is electrically coupled through the circuit patterns 22 to semiconductor chip 26 and interconnection balls 24.

Electrically conductive adhesive material 46 may be a metal-filled epoxy or other polymeric material. Of course, other conductors, such as metal bond wires or leads may be used instead of adhesive material 46, provided that the discrete device 36 may be bonded with such a conductor, which is not always the case.

An insulative encapsulant material 48 covers a central portion of bottom surface 16 of substrate 12 inward of interconnection balls 24. In particular, insulative encapsulant material 48 fills first and second apertures 18 and 20, and covers semiconductor chip 26 (including active surface 30 and sides 31), discrete device 26 (including second surface 40 and sides 42), bond wires 34, and electrically conductive adhesive 46. Encapsulant material 48 does not, however, cover inactive surface 28 of semiconductor chip 26 or first surface 38 of discrete device 36, which allows heat to freely dissipate from those surfaces. Rather, inactive surface 28 and first surface 38 are exposed in the horizontal plane of top surface 14 of substrate 12, and are flush with an upper flat portion of encapsulant material 48 within first and second apertures 18 and 20.

A height of encapsulant material 48 from bottom surface 16 of substrate 12 to lower flat surface 49 of encapsulant material 48 is about 0.1 mm less than a height of interconnection balls 24, which provides clearance between encapsulant 48 and a mounting substrate upon reflow of the interconnection balls 24. Typically, encapsulant material 48 is a molded plastic material, e.g., an epoxy-based compound, although encapsulant 48 could also be a glob top.

Optionally, a protective layer 50 (shown by dash lines) may be adhered over all or a sub-part of top surface 14 of substrate 12. For instance, in FIG. 1, the protective layer 50 covers all of top surface 14 of substrate 12, as well as inactive surface 28 of semiconductor chip 26 and first surface 38 of discrete device 36. Alternatively, a small patch of a protective layer 50 may span over first surface 38 of discrete device 36 and a subportion of top surface 14 around second aperture 18, but not over other portions of top surface 14. Protective layer 50 may be, for example, a polyimide or metal tape with an electrically insulative but thermally conductive adhesive layer thereon attaching it to the top surface 14. A metal layer 50 would provide heat dissipation capability.

Figure 1A:
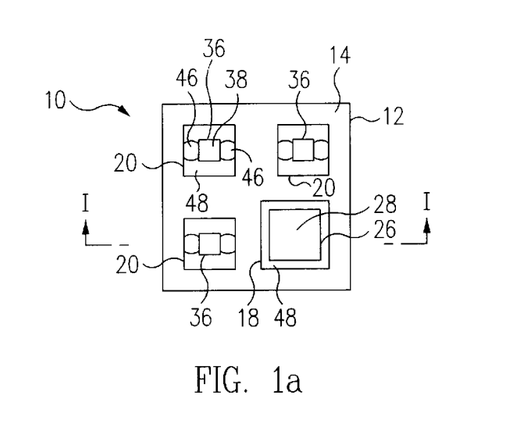
FIG. 1A is a top plan view of the semiconductor package of FIG. 1.
Figure 1B:
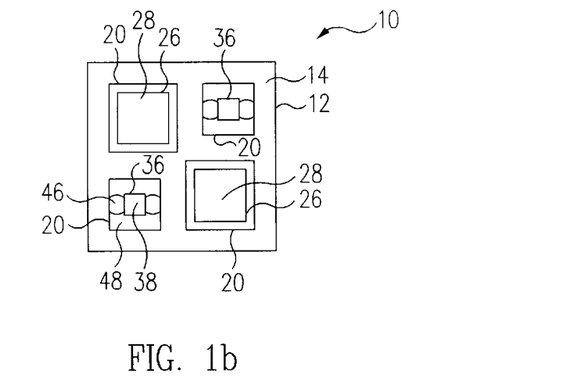
FIG. 1B is a top plan view of an alternative version of the semiconductor package of FIG. 1.

As mentioned, semiconductor package 10 may include one semiconductor chip 26 and one discrete device 36, or plural semiconductor chips 26 with one or more discrete devices 36. Other variations are possible, depending on the application. From FIG. 1a, which is a top plan view of semiconductor package 10 absent optional protective layer 50, it is seen that package 10 includes three discrete devices 36 adjacent to one semiconductor chip 26. FIG. 1b is a top plan view of an alternative version of semiconductor package 10 that includes two semiconductor chips 26 and two discrete devices 36. The plural semiconductor chips 26 may the same or different types, and the plural discrete devices 36 may be the same or different types. In addition, in all of the embodiments described herein, a pair of semiconductor chips 26 may be stacked in first aperture 18, as exemplified by the embodiments shown in FIGS. 7 and 8, which are discussed below.

Figure 2A:
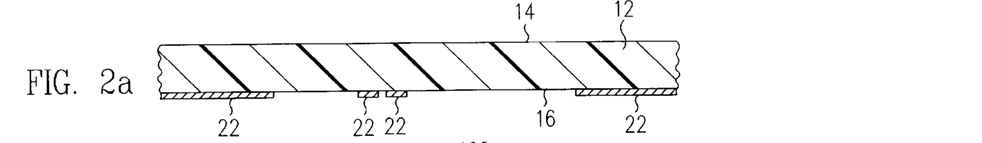

FIGS. 2a–2f provide cross-sectional views of stages in an exemplary method of making semiconductor package 10 of FIG. 1. Referring to FIG. 2(a), a substrate 12 is provided that includes a layer of circuit patterns 22 on bottom surface 16. Substrate 12 may be part of a larger sheet including a matrix of substrates 12 so that plural semiconductor packages 10 may be assembled in parallel. Slots through the substrate sheet may be provided partially around each substrate 12 to aid in singulating the packages after assembly.

Figure 2B:
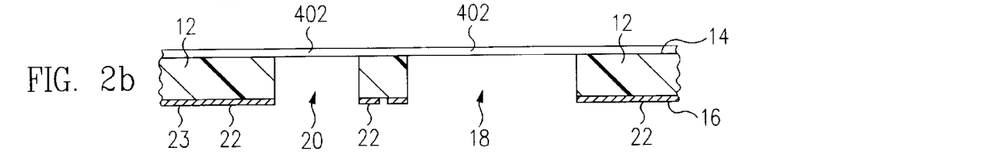

In FIG. 2(b), first and second apertures 18 and 20 are formed through substrate 12 using, for instance, a mechanical drill, punch, laser, or etch process. A support layer 402 is then provided over top surface 14 of substrate 12 so that first and second apertures 18 and 20 are fully covered by support layer 402. Support layer 402 may be, for instance, a polyimide or other plastic tape or a metal tape that is attached to top surface 14 with an adhesive layer.

Figure 2C:
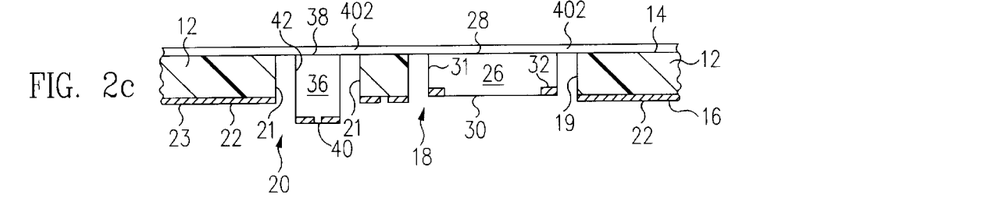

In FIG. 2(c), inactive surface 28 of semiconductor chip 26 and first surface 38 of discrete device 36 are adhered to support layer 402 within first and second apertures 18 and 20, respectively.

Figure 2D:
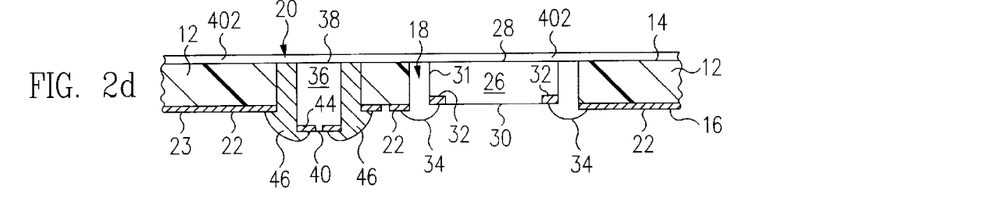

In FIG. 2(d), bond pads 32 of semiconductor chip 26 are electrically coupled to the inner ends of circuit patterns 22 of bottom surface 16 of substrate 12. In this example, bond wires 34 are used to electrically couple bond pads 32 to circuit patterns 22, but other conductors may be used. In addition, two bodies of an electrically conductive adhesive material 46 are applied within aperture 19 so as to respectively electrically couple terminals 44 of discrete device 36 to respective circuit patterns 22. Electrically conductive adhesive material 46 may be applied in liquid form by a syringe. Alternatively, such an electrically conductive adhesive material 46 may be applied by screen printing. In the latter case, it may be appropriate to screen print before the bonding of wires 34. Electrically conductive adhesive material 46 must be sufficiently thixotropic to stay in place until it is hardened by curing so that electrical connectivity is maintained.

Figure 2E:
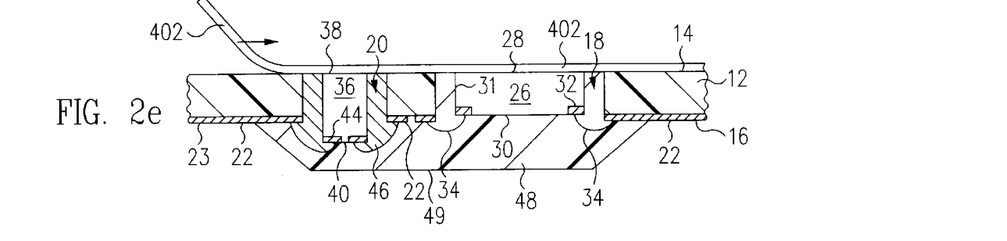

In FIG. 2(e), an insulative encapsulant 48 is applied within first and second apertures 18 and 20 so as to cover semiconductor chip 26, bond wires 34, discrete device 36, and electrically conductive adhesive material 46. Encapsulant 48 may be a plastic compound formed by molding. Support layer 402 stops the flow of conductive adhesive material 46 and encapsulant 48 so that the top surface 14 of substrate 12, as well as inactive surface 28 of semiconductor chip 26 and first surface 38 of discrete device 36, are not covered by conductive adhesive material 46 or encapsulant 48. Encapsulant 48 is then hardened by curing. Subsequently, support layer 402 may be removed so as to expose inactive surface 28 of semiconductor chip 26 and first surface 38 of discrete device 36. If desired, support layer 402 may be left in place. The method of removal of support layer 402 may require the application of ultraviolet light or heat depending on the type of adhesive used to hold support layer 402 in place.

Figure 2F:
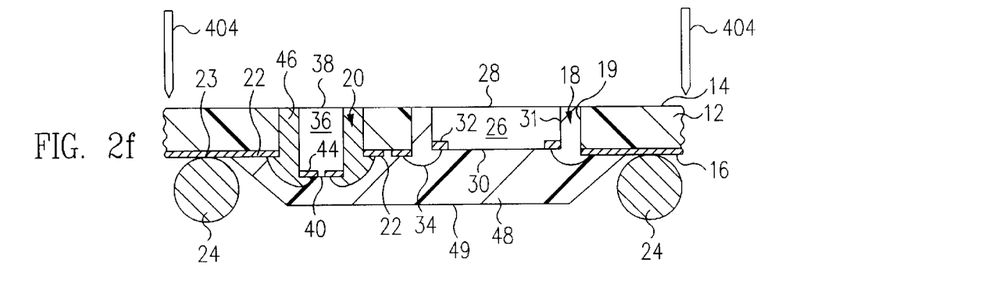

Finally, in FIG. 2(f), metal interconnection balls 24 are fused to lands 23 of circuit patterns 22 of bottom surface 16 of substrate 12. Subsequently, each semiconductor package 10 is singulated from the larger substrate sheet with a saw 404, or some equivalent device, such as a punch or laser. If support layer 402 remains in place, it may be cut through around each substrate 12 and left in place on the semiconductor package 10, thereby forming optional protective layer 50 of FIG. 1.

Figure 3:
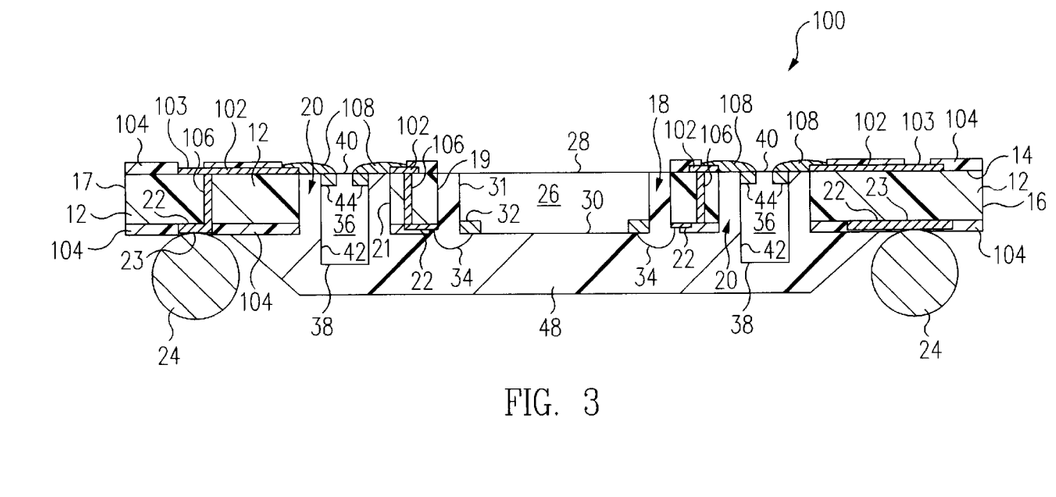
FIG. 3 is a cross-sectional side view of another embodiment of a semiconductor package in accordance with the present invention.

FIG. 3 is a cross-sectional side view of a semiconductor package 100 in accordance with a second embodiment of the present invention. Many of the component parts of semiconductor package 100 (and of semiconductor package 200 discussed below) are the same as those of package 10 of FIG. 1, and hence the following discussion is abbreviated to focus on the differences between the various embodiments, given that the reader already is informed of the common components.

Unlike semiconductor package 10 of FIG. 1, semiconductor package 100 of FIG. 3 includes a central semiconductor chip 26 located transversely between a pair of discrete devices 36. Of course, the number of components may vary. That is, package 100 may have one semiconductor chip 26 and two discrete devices 36, or may have two semiconductor chips 26 and four discrete devices 36, or some other combination thereof. Each semiconductor chip 26 is disposed in a first aperture 18 through substrate 12, and each discrete device 36 is in a separate second aperture 20 through substrate 12.

Hardened insulative encapsulant 48 fills first and second apertures 18 and 20 of semiconductor package 100 of FIG. 3. Encapsulant 48 also covers active surface 30 and sides 31 of semiconductor chip 26, first surface 38 and sides 42 of discrete device 36, bond wires 34, sidewalls 19 and 21 of apertures 18 and 20 of substrate 12, and a central portion of bottom surface 16 of substrate 12 inward of interconnection balls 24. Encapsulant 48 does not, however, cover inactive surface 28 of semiconductor chip 26 or second surface 40 of discrete device 36. Inactive surface 28 is exposed for heat dissipation, and second surface 40 is exposed for conductive connections to be made to terminals 44 of discrete device 36.

In semiconductor package 100 of FIG. 3, discrete devices 36 are oriented in a direction opposite the direction of the discrete device 36 of semiconductor package 10 of FIG. 1. That is, second surface 40 and terminals 44 of discrete devices 36 of semiconductor package 100 are oriented in the same direction as top surface 14 of substrate 12. Meanwhile, as in FIG. 1, active surface 30 of semiconductor chip 26 is oriented in the same direction as bottom surface 16 of substrate 12 and interconnection balls 24.

To accommodate this orientation of discrete devices 36, substrate 12 of semiconductor package 100 of FIG. 3 includes a layer of electrically conductive circuit patterns 102 on top surface 14 of substrate 12. All or at least some of the circuit patterns 102 are electrically coupled through substrate 12 to one or more circuit patterns 22 of bottom surface 16 by one of a plurality of vias 106 that extend vertically through substrate 12. Vias 106 may be formed by filling or lining holes through substrate 12 with metal, conductive ink, or some other electrically conductive material.

A patterned layer 108 of an electrically conductive material is used to electrically couple each terminal 44 of each discrete device 36 to a respective adjacent one of the circuit patterns 102 of top surface 14 of substrate 12. Each electrically conductive layer 108 contacts both the respective terminal 44 of discrete device 36 and the adjacent inner end of the respective circuit pattern 102, thereby electrically coupling the terminal 44 and circuit pattern 102. Layer 108 extends over an upper flat portion of the hardened encapsulant material 48 in second aperture 19 around discrete device 36 between the terminal 44 and circuit pattern 102. For each discrete device 36, two layers 108 are used, since discrete device 36 has two terminals 44. However, additional layers 108 would be used for a different discrete device 36 with more than two terminals 44.

Accordingly, each discrete device 36 of package 100 of FIG. 3 is electrically coupled to the semiconductor chip 26 and/or to one or more interconnection balls 24 through electrically conductive layers 108, circuit patterns 102, vias 106, and circuit patterns 22. As mentioned, bond wires 34 electrically couple semiconductor chip 26 to the inner ends of circuit patterns 22 of substrate bottom surface 16, and interconnection balls 24 are fused to lands 23 at the outer ends of circuit patterns 22.

Layers 108 may be comprised of a variety of electrically conductive materials. For instance, layer 108 may be a metal-filled epoxy-based adhesive material, a solder paste, or a conductive ink that is applied on top surface 14 and the flat upper portion of encapsulant 48 by screen printing or stenciling methods. Alternatively, layer 108 may be a metal layer (e.g., copper or aluminum). Such a metal layer 108 may be applied, for instance, by forming a mask (e.g., photoresist) over top surface 14 of substrate 12, the upper flat portion of encapsulant 48, inactive surface 28 of semiconductor chip 26, and second surface 40 of discrete device 40, and then plating, sputter depositing, or evaporating a metal layer in the unmasked regions. Alternatively, layer 108 may be formed by screen printing, coating, or plating a metal or some other electrically conductive material in a layer over those areas, and then laser ablating the electrically conductive material where it is not desired, thereby forming a patterned layer 108.

Returning to FIG. 3, a layer 104 of an electrically insulative solder mask material, which may be epoxy based, may be disposed over top and bottom surfaces 14 and 16 of substrate 12. Apertures in solder mask layer 104 expose portions of circuit patterns 102 for the connection of layer 108, bond wires 34 or interconnection balls 24 thereto. Optionally, some of the circuit patterns 102 of top surface 14 of substrate 12 may include lands 103 that are exposed through apertures in solder mask layer 104. If so, then another semiconductor package 100 (or a semiconductor package 10 or 200) may be stacked over top surface 14 of substrate 12, so that the interconnection balls 24 of the upper package 100 may be electrically coupled to the lower package 100 through lands 103.

An aspect of package 100 of FIG. 3 is that the terminals 44 of discrete devices 36 may be electrically tested by test probes located above the top surface 14 of substrate 12. If discrete device 36 is an optical device, it may be accessed by a light source located above top surface 14.

An exemplary method of making semiconductor package 100 of FIG. 3 is very similar to the method shown in FIGS. 2(a)–2(f). In view of the above explanation of FIGS. 2(a)–2(f), most of which applies directly to the method of making package 100, only differences between the methods need be discussed.

Figure 4A:
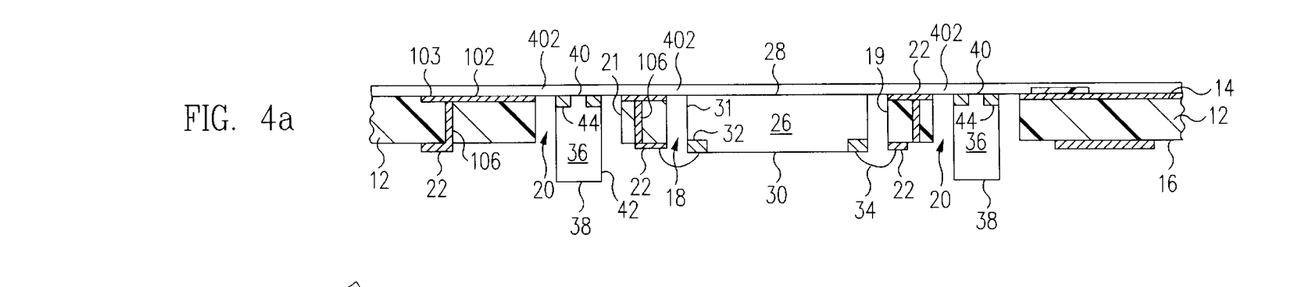

FIG. 4(a) shows a portion of the process of making semiconductor package 100 after the steps of: providing a substrate 12 with first and second apertures 18 and 20; adhering a support layer 402 to top surface 14 of substrate 12; adhering semiconductor chip 26 and discrete device 36 to support layer 402 within first and second apertures 18 and 20, respectively; and electrically coupling semiconductor chip 26 to circuit patterns 22. Note that second surface 40 of discrete device 36 is adhered to support sheet 402.

Figure 4B:
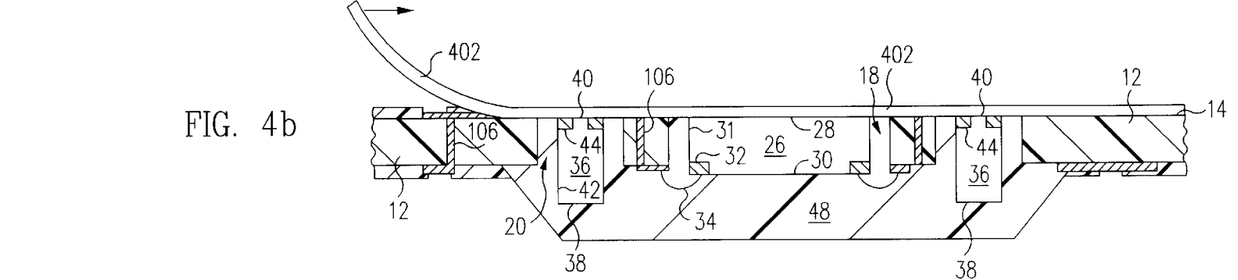

In FIG. 4(b), insulative encapsulant 48 is provided within first and second apertures 18 and 20, and over semiconductor chip 26, discrete device 36, and bond wires 34. Subsequently, after insulative encapsulant 48 is cured, support layer 402 is removed.

Figure 4C:
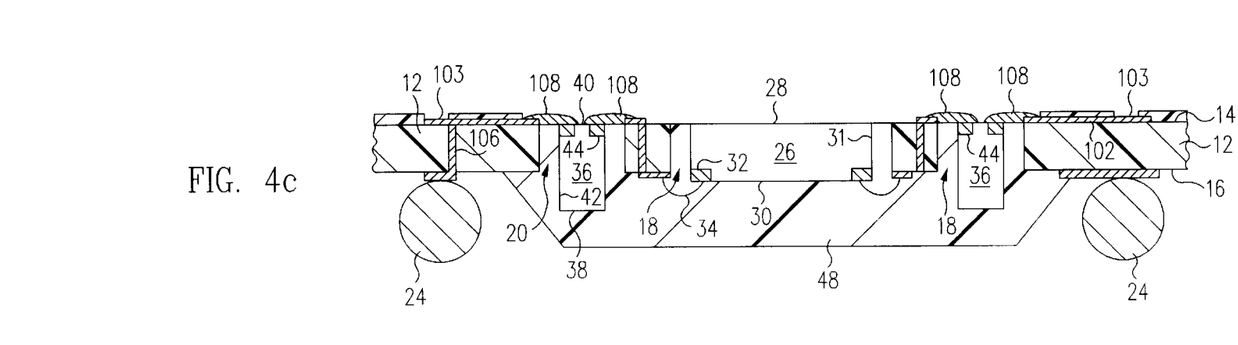

In FIG. 4(c), a patterned layer 108 of an electrically conductive material is formed over selected regions in the plane of top surface 34 of substrate 12. Each layer 108 overlies a terminal 44 of discrete device 36, a flat region of encapsulant 48, and an adjacent inner end of a circuit pattern 22 of top surface 14, thereby forming an electrical connection. As mentioned, layer 108 may be formed by screening or stenciling an electrically conductive epoxy, solder paste, or conductive ink. Other methods of forming layer 108 are mentioned above.

Returning to FIG. 4(c), interconnection balls 24 may be fused to lands 23 of circuit patterns 22 either before or after the step of forming patterned layer 108. Subsequently, the semiconductor packages 100 may be singulated from the larger substrate sheet.

Figure 5:
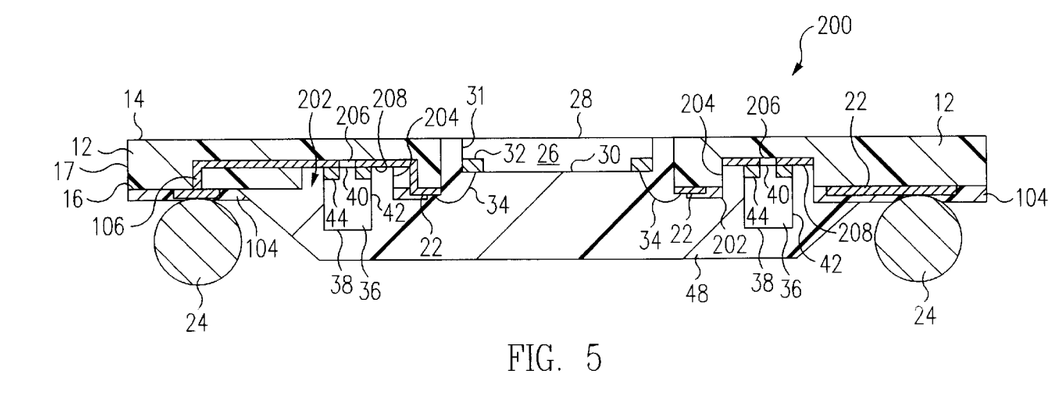
FIG. 5 is a cross-sectional side view of another embodiment of a semiconductor package in accordance with the present invention.

FIG. 5 is a cross-sectional side view of a semiconductor package 200 in accordance with a third embodiment of the present invention. Unlike semiconductor packages 10 and 100 of FIGS. 1 and 3, respectively, discrete devices 36 of semiconductor package 200 are disposed in respective pockets 202 of substrate 12, rather than in apertures 20 that extend fully through substrate 12.

In particular, substrate 12 of semiconductor package 200 includes a plurality of pockets 202, each of which extends only part of the vertical distance through substrate 12 from bottom surface 16 to top surface 14. Pockets 202 each include an orthogonal sidewall 204, an opening in the plane of bottom surface 16, and a horizontal floor 206. Horizontal floor 206 is parallel to top surface 14 and bottom surface 16 and is a selected distance (e.g., midway) between bottom surface 16 and top surface 14 of substrate 12. A plurality of electrically conductive circuit patterns 208 are disposed on floor 206 of each pocket 202. Circuit patterns 208 extend horizontally into substrate 13 from pockets 202. Substrate 12 may be a multi-layer laminate or a multi-layer ceramic substrate with metal (e.g., copper) circuit patterns 22, 208, among other possibilities.

Each discrete device 36 is disposed in a respective one of the pockets 202 of substrate 12 of semiconductor package 200. The terminals 44 of second surface 40 of each discrete device 36 face and are each electrically and physically coupled to the inner end of a respective one of the circuit patterns 208 on floor 206 of the respective pocket 202. The electrical and physical coupling can be effected by using a metallic solder or solder paste, or by attaching the terminals 44 to circuit patterns 208 using an electrically conductive adhesive material, such as a metal-filled epoxy material.

Circuit patterns 208 of substrate 12 of semiconductor package 200 also are electrically coupled by vertical vias 106 through substrate 12 to circuit patterns 22 of bottom surface 16 of substrate 12. As with semiconductor packages 10 and 100 discussed above, a semiconductor chip 26 in first aperture 20 of substrate 12 is electrically coupled by bond wires 34 to inner ends of circuit patterns 22. Lands 23 at the outer ends of at least some of the circuit patterns 22 are electrically coupled to interconnection balls 34. Accordingly, semiconductor chip 26 and discrete devices 36 may be electrically coupled to each other and to interconnection balls 24 through circuit patterns 22, 208, bond wires 24, and vias 106.

An exemplary method of making semiconductor package 200 of FIG. 5 is very similar to the method shown in FIGS. 2(a)–2(f) and FIGS. 4(a)–4(c). In view of the discussion above, only differences between the methods need be discussed.

Figure 6A:
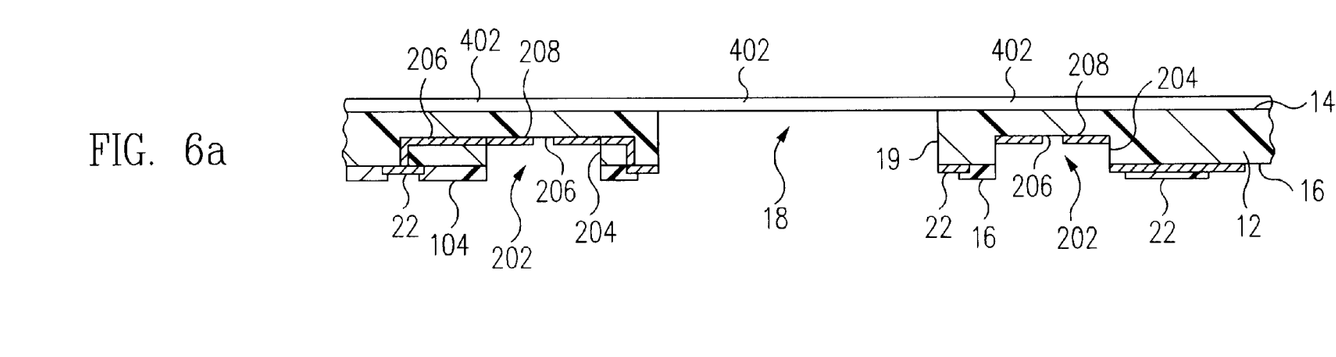
FIGS. 6a–6b are cross-sectional side views of portions of an assembly process in accordance with the present invention for making the semiconductor package of FIG. 5.

Referring to FIG. 6(a), a method of making semiconductor package 200 includes provision of a substrate 12 having a first aperture 18 and a plurality of pockets 202 opening at bottom surface 16 of substrate 12. Each pocket 202 includes a floor 206 upon which conductive circuit patterns 208 are provided. A support layer 402 is attached to top surface 16 of substrate 12 over first aperture 18.

Figure 6B:
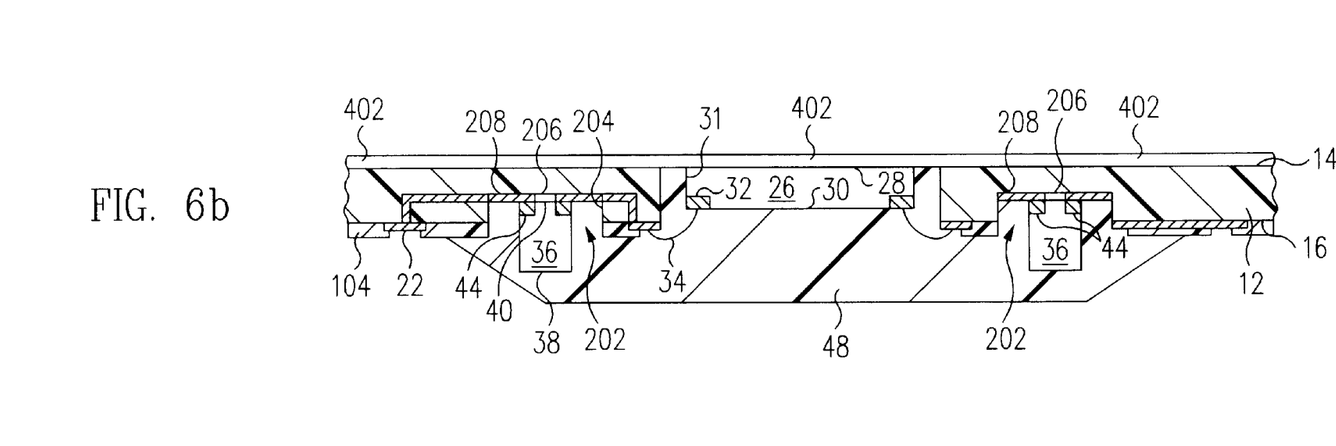

In FIG. 6(b), inactive surface 28 of semiconductor chip 26 is attached to support layer 402 within first aperture 18, and bond pads 32 are electrically coupled by bond wires 34 to circuit patterns 22 of bottom surface 16 of substrate 12. Discrete device 36 is coupled to floor 206 of pocket 202. In particular, terminals 44 of discrete device 36 are electrically coupled to circuit patterns 208 using solder, solder paste, or an electrically conductive adhesive (e.g., metal-filled epoxy). Subsequently, a plastic insulative encapsulant 48 is formed in first aperture 18 and in pockets 202 by molding. After encapsulant 48 is cured, support layer 402 may be removed. Subsequently, interconnection balls 24 are fused to lands 23 of circuit patterns 22, and the respective semiconductor package 200 is singulated from the larger substrate sheet.

An aspect of each of the exemplary semiconductor packages discussed herein is that they are much thinner than the conventional BGA semiconductor package mentioned above, notwithstanding the presence of the one or more tall discrete devices 36, because each semiconductor chip 26 is disposed in a first aperture 18 that extends through substrate 12, and each discrete device 36 is disposed in either a second aperture 20 through substrate 12 or a pocket 202 that extends partially through substrate 12. Accordingly, a thin profile is achieved notwithstanding that the discrete device 36 may have a height (from first surface 38 to second surface 40) that is greater than both a height of semiconductor chip 26 (between inactive and active surfaces 28 and 30) and a height of substrate 12 (between top surface 14 and bottom surface 16).

For example, a typical substrate 12 may have a height of between about 0.3 and 1.5 mm. A typical semiconductor chip 26 may have a height between about 0.15 and 0.5 mm.

And, a typical discrete device 36 may have a greater height of between about 0.25 and 3 mm, or even more that 3 mm. Alternatively, discrete device 36 may have a height that is about one to two (e.g., at least 1.5 or 2 times) the height of substrate 12 and about 1.6 to 3 times the height of semiconductor chip 26.

Accordingly, the present invention provides, among other things, semiconductor packages that are thinner than conventional semiconductor packages that contain both a semiconductor chip(s) and a discrete device(s).

Figure 7:
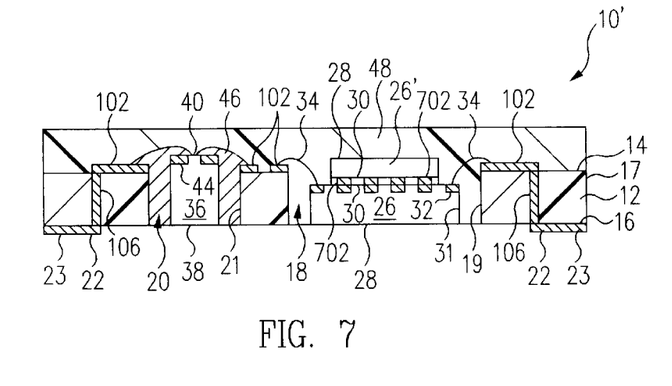
FIG. 7 is a cross-sectional side view of another embodiment of a semiconductor package in accordance with the present invention.

Variations of the exemplary semiconductor packages disclosed herein may be apparent in view of the discussion above. For instance, FIG. 7 shows a semiconductor package 10' that has similarities to semiconductor package 10 of FIG. 1. In semiconductor package 10', however, interconnection balls 24 are omitted, and lands 23 at the outer ends of the circuit patterns 22 of bottom surface 16 of substrate 12 are used as the input/output terminals of the package. A thin layer of solder or an electrically conductive adhesive may be pre-applied on lands 23 to facilitate electrical coupling of semiconductor package 10' to a mounting substrate, e.g., a printed circuit board.

In addition, semiconductor package 10' includes a second semiconductor chip 26' that is stacked on a lower first semiconductor chip 26 that is within first aperture 20. The active surface 30 of the lower first semiconductor chip 26 and second surface 40 and terminals 44 of discrete device 30 are oriented in the same direction as top surface 14 of substrate 16. Meanwhile, first surface 38 of discrete device 36 and inactive surface 28 of first semiconductor chip 26 are exposed in the horizontal plane of bottom surface 16 of substrate 12. The bond pads 32 of the active surface 30 of the second semiconductor chip 26' face and are electrically coupled to respective ones of the bond pads 32 of the first semiconductor chip 26 by interconnects 702 in a flip chip style connection. Other bond pads 32 of the lower first semiconductor chip 26 are electrically coupled to selected top circuit patterns 102 by bond wires 34. An electrically conductive adhesive material 46 electrically couples the terminals 44 of discrete device 36 to top circuit patterns 102 of top surface 14 of substrate 12. Finally, insulative encapsulant 48 is formed, e.g., by molding, on top surface 14 of substrate 12. In this case, the encapsulant 48 is gang molded over a sheet of substrates 12 that are assembled in parallel, and then both the substrate sheet and the encapsulant 48 are severed during the singulation step, yielding the orthogonal sides of encapsulant 48, which are coplanar with sides 17 of substrate 12.

Figure 8:
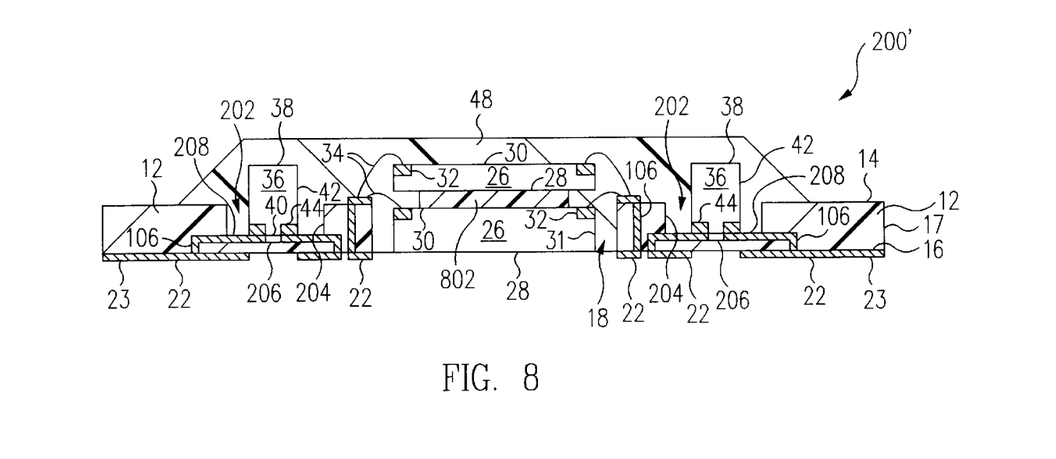
FIG. 8 is a cross-sectional side view of another embodiment of a semiconductor package in accordance with the present invention.

As another example, FIG. 8 shows a semiconductor package 200' that has similarities to semiconductor package 200 of FIG. 5. Package 200' differs by including a pair of stacked semiconductor chips 26 within first aperture 18. The active surface 30 of both semiconductor chips 26 is oriented in the same direction as top surface 14 of substrate 12. The bond pads 32 of both semiconductor chips 26 are electrically coupled by low loop bond wires 34 to circuit patterns 102 of top surface 14. An insulative spacer 802, which may be an adhesive film, or a silicon or quartz slug coated with an insulative adhesive, provides clearance for the bond wires 34 that are connected to the lower semiconductor chip 26. Discrete devices 36 are each disposed in a pocket 202 that opens through top surface 14 of substrate 12. Terminals 44 face and are electrically coupled to circuit patterns 208 within pocket 202.

Figure 9:
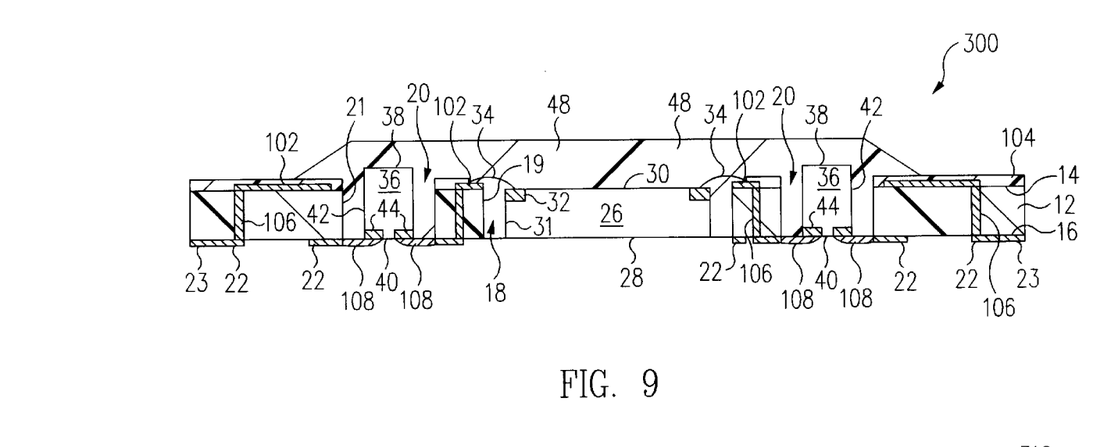
FIG. 9 is a cross-sectional side view of another embodiment of a semiconductor package in accordance with the present invention.

As another example, FIG. 9 shows a semiconductor package 300 that is similar to semiconductor package 100 of FIG. 3. Package 300 includes at least one semiconductor chip 26 and at least two taller discrete devices 36, as in package 100. In this instance, however, lands 23 serve as the input/output terminals of the package rather than interconnection balls 24. Further, the relative orientations of semiconductor chip 26 and passive devices 36 are reversed. In package 300, semiconductor chip 26 has its inactive surface 28 exposed in the horizontal plane of bottom surface 16 of substrate 12. Active surface 30 is oriented in the same direction as top surface 14 of substrate 12, and bond wires 34 electrically couple bond pads 32 to circuit patterns 102 of top surface 14. Further, each discrete device 36 has its second surface 40 in the horizontal plane of bottom surface 16 of substrate 12. Electrically conductive layers 108 extend over a bottom flat portion of insulative encapsulant 48 to electrically couple the terminals 44 of discrete device 36 to circuit patterns 22 on bottom surface 16. The height of electrically conductive layers 108 below bottom surface 16 must be sufficiently small to avoid interference with the electrical coupling of lands 23 to a mounting surface, such as a printed circuit board. Electrically conductive layers 108 may be, for example, a layer of an adhesive metal-filled polymer-based material, or a sputtered or evaporated metal.

Figure 10:
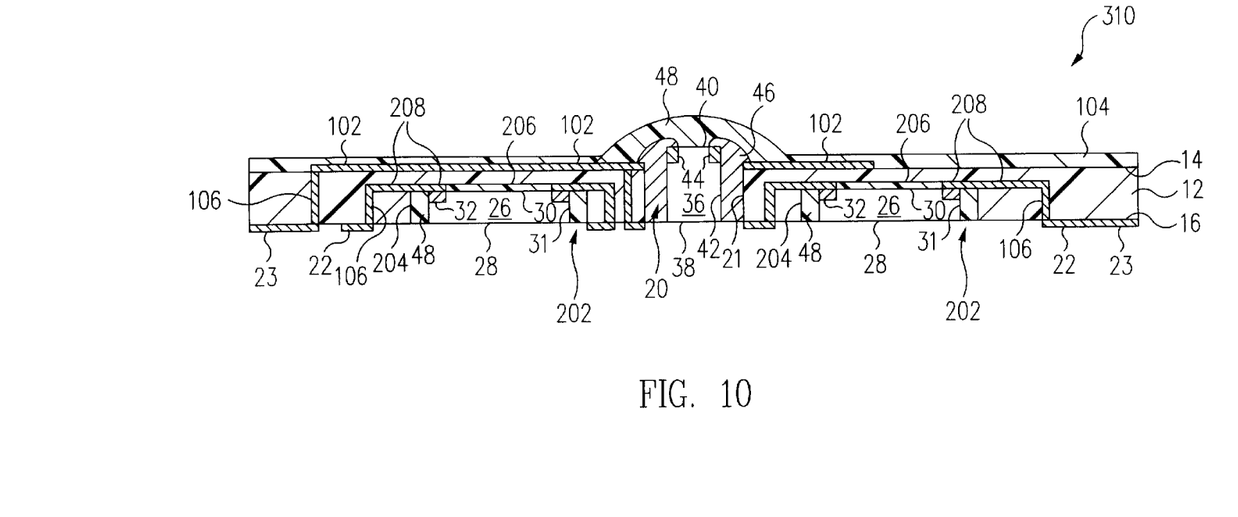
FIG. 10 is a cross-sectional side view of another embodiment of a semiconductor package in accordance with the present invention.

As a final example of an alternative package, FIG. 10 shows a semiconductor package 310 that has similarities to semiconductor package 10 of FIG. 1 and to semiconductor package 200 of FIG. 5. In package 310, a semiconductor chip 26 is disposed in each of the two pockets 202, and a taller discrete device 36 is located in a central aperture 20. The semiconductor chips 26 may be thinned by polishing inactive surface 28. Each of the semiconductor chips 26 is oriented so that its active surface 30 faces floor 206 of the respective pocket 202. Bond pads 32 of the active surface 30 face and are electrically and physically coupled to circuit patterns 208 on floor 206. A discrete body of an insulative encapsulant 48 fills pocket 202. Inactive surface 28 and the flat bottom surface of the insulative encapsulant 48 are in the horizontal plane of, or slightly above the horizontal plane of, bottom surface 16. Encapsulant 48 may be applied using a liquid encapsulation, glob top, or molding technique. The discrete device 36 is disposed in aperture 20 so that its second surface 40 is oriented in the same direction as top surface 14 of substrate 12, and its first surface 38 is oriented in the same direction as, and is in the same horizontal plane as, bottom surface 16. Terminals 44 of passive device are electrically coupled by an electrically conductive encapsulant 46 to circuit patterns 102 of top surface 14 of substrate 12. A cap of an insulative encapsulant 48, which may be formed by liquid encapsulation, molding, or glob top techniques, covers each of the bodies of electrically conductive encapsulant 46 and a portion of top surface 14 of substrate 12 around aperture 20, and fills aperture 20 around discrete device 36. Lands 23 serve as the input/output terminals of the package.

Package 310 has application where the substrate and discrete device are much taller than the semiconductor chip 26, and where it is desirable to protect the semiconductor chips 26 within pockets 202. To make package 310, the semiconductor chips 26 are disposed in pockets 202, electrically coupled to the circuit patterns 208 therein, and encapsulated by insulative encapsulant 48. After the encapsulant 48 is cured, a support layer 402 (FIG. 2(b)) is attached to bottom surface 16 of substrate 18 at least across aperture 20. Subsequently, first surface 38 of discrete device 36 is attached to the support layer 402 within aperture 20. Next, electrically conductive encapsulant 46 is applied by, for example, syringe or screen printing, and after curing is covered by insulative encapsulant 48.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
    a substrate having a first surface, an opposite second surface, a plurality of circuit patterns, a first aperture through the substrate between the first and second surfaces, and a second aperture that extends at least partly through the substrate between the first and second surfaces;
    a semiconductor chip including an active surface and an opposite inactive surface, wherein the semiconductor chip is disposed in the first aperture and is electrically coupled to some of the circuit patterns;
    an electronic discrete device disposed in the second aperture and electrically coupled to some of the circuit patterns;
    a hardened encapsulant material filling the first and second apertures and contacting the semiconductor chip and discrete device.

2. The semiconductor package of claim 1, wherein the discrete device has a height between opposing first and second surfaces thereof that is greater than a corresponding height of the substrate between the first and second surfaces thereof and a corresponding height of the semiconductor chip between the active and inactive surfaces thereof.

3. The semiconductor package of claim 2, wherein the second aperture extends through the substrate from the first surface to the second surface.

4. The semiconductor package of claim 3, wherein all of the circuit patterns of the substrate are on the second surface of the substrate, and the inactive surface of the semiconductor chip and one of the first or second surfaces of the discrete device are in a same horizontal plane as the first surface of the substrate.

5. The semiconductor package of claim 3, wherein the circuit patterns comprise first circuit patterns at the first surface of the substrate and second circuit patterns at the second surface of the substrate, with at least some of said first and second circuit patterns being electrically coupled through the substrate, and the discrete device and the semiconductor chip are electrically coupled to some of the first circuit patterns.

6. The semiconductor package of claim 3, wherein the circuit patterns comprise first circuit patterns at the first surface of the substrate and second circuit patterns at the second surface of the substrate, with at least some of said first and second circuit patterns being electrically coupled through the substrate, the discrete device is electrically coupled to some of the first circuit patterns, and the semiconductor chip is electrically coupled to some of the second circuit patterns.

7. The semiconductor package of claim 3, wherein the discrete device includes terminals electrically coupled to the circuit patterns, and said terminals are oriented in an opposite direction to a direction of the active surface of the semiconductor chip.

8. The semiconductor package of claim 3, wherein the discrete device includes terminals electrically coupled to the circuit patterns, and said terminals are oriented in a same direction as a direction of the active surface of the semiconductor chip.

9. The semiconductor package of claim 1, wherein the second aperture extends only partially through the substrate between the first and second surfaces of the substrate, and the discrete device is electrically coupled to some of said circuit patterns within the second aperture.

10. The semiconductor package of claim 9, wherein the discrete device includes terminals electrically coupled to the circuit patterns, and said terminals are oriented in an opposite direction to a direction of the active surface of the semiconductor chip.

11. The semiconductor package of claim 1, wherein a surface of the discrete device and at least one of the active or inactive surfaces of the semiconductor chip are in a common horizontal plane with one of the first or second surfaces of the substrate.

12. A semiconductor package comprising:

a substrate having a first surface, an opposite second surface, a plurality of circuit patterns, and first and second apertures through the substrate between the first and second surfaces;

a semiconductor chip including an active surface and an opposite inactive surface, wherein the semiconductor chip is disposed in the first aperture and is electrically coupled to some of the circuit patterns;

an electronic discrete device disposed in the second aperture and electrically coupled to some of the circuit patterns, wherein a surface of the discrete device and the inactive surface of the semiconductor chip are in a same horizontal plane as one of the first or second surfaces of the substrate; and a hardened insulative encapsulant material filling the first and second apertures and contacting the semiconductor chip and discrete device.

13. The semiconductor package of claim 12, wherein an electrically conductive adhesive material electrically couples the discrete device to the circuit patterns.

14. The semiconductor package of claim 12, further comprising a plurality of input/output terminals of said package electrically coupled to some of the circuit patterns, wherein the active surface of the semiconductor chip is oriented in a same direction as the input/output terminals.

15. The semiconductor package of claim 12, further comprising a plurality of input/output terminals of said package electrically coupled to some of the circuit patterns, wherein the active surface of the semiconductor chip is oriented in an opposite direction as the input/output terminals.

16. The semiconductor package of claim 12, wherein the discrete device has a height between opposed first and second surfaces thereof that is greater than a corresponding height of the substrate between the first and second surfaces thereof and a corresponding height of the semiconductor chip between the active and inactive surfaces thereof.

17. The semiconductor package of claim 12, wherein the discrete device includes terminals electrically coupled to the circuit patterns, and said terminals are oriented in an opposite direction to a direction of the active surface of the semiconductor chip.

18. The semiconductor package of claim 12, wherein the discrete device includes terminals electrically coupled to the circuit patterns, and said terminals are oriented in a same direction as the active surface of the semiconductor chip.

19. A package comprising:

a substrate having a first surface, an opposite second surface, a plurality of circuit patterns, a first aperture through the substrate between the first and second surfaces, and a second aperture that extends at least partly through the substrate between the first and second surfaces;

first and second electrical devices of different types, each having terminals thereon and a same-direction height between commonly oriented opposed surfaces, with at least one of the surfaces of each device being disposed in a common plane with one of the first and second surfaces of the substrate, wherein the height of the first electrical device is greater than the height of the second electrical device, the first electrical device is in the first aperture and the second electronic device is in the second aperture, and the first and second electrical devices are electrically coupled to the circuit patterns;

input/output terminals coupled to the substrate and electrically coupled to the circuit patterns; and a hardened encapsulant material filling the first and second apertures and contacting the first and second electrical devices.

20. The package of claim 19, wherein at least one of the first and second electrical devices is a semiconductor chip.

21. The package of claim 19, wherein the second aperture also extends through the substrate between the first and second surfaces, and the terminals of the first and second electrical devices are oriented in a common direction.

22. The package of claim 19, wherein at least one of the first and second electrical devices is electrically coupled to the circuit patterns by an electrically conductive adhesive material.

23. The package of claim 19, wherein at least one of the first and second electrical devices is an electronic discrete device.

24. The package of claim 19, wherein at least one of the first and second electrical devices is electrically coupled to the circuit patterns by an electrically conductive adhesive material, and the terminals of the first and second electrical devices are oriented in a same direction as the input/output terminals.

25. A package comprising:

a substrate having a first surface, an opposite second surface, a plurality of circuit patterns, and a first aperture at least partly through the substrate between the first and second surfaces;

an electrical device in the first aperture, said electrical device electrically coupled to the circuit patterns by an electrically conductive adhesive material; and a hardened encapsulant material filling the first aperture and covering the electrical device.

26. The package of claim 25, wherein the circuit patterns are only on one of the first and second surfaces of the substrate, the other of the first and second surfaces being devoid of any circuit patterns.

27. The package of claim 25, wherein the electrical device is an electronic discrete device.

28. The package of claim 25, wherein the substrate includes a second aperture through the substrate between the first and second surfaces, and further comprising:

a second electrical device in the second aperture, said second electrical device being coupled to the circuit patterns and having a surface in a common plane with one of the first and second surfaces of the substrate.

29. The package of claim 28, wherein said circuit patterns are only on one of the first and second surfaces of the substrate, the other surface being devoid of any circuit patterns, and further comprising input/output terminals coupled to the substrate and electrically coupled to the circuit patterns, wherein the first and second electrical devices include terminals oriented in a same direction as the input/output terminals.

30. The package of claim 25, wherein the substrate includes a second aperture at least partly through the substrate between the first and second surfaces, and further comprising:

a second electrical device in the second aperture, said second electrical device being of a different type than the first electrical device and electrically coupled to the circuit patterns, wherein a hardened encapsulant material is within said second aperture in contact with the second electrical device.

31. The package of claim 30, wherein at least one of the first and second apertures extends through the substrate between the first and second surfaces.

32. The package of claim 31, wherein the first aperture is through the substrate between the first and second surfaces.

* * * * *